(12) United States Patent
Ng

(10) Patent No.: US 8,839,084 B2
(45) Date of Patent: Sep. 16, 2014

(54) DIGITAL ARCHITECTURES FOR SERIAL DATA STREAM OPERATIONS

(75) Inventor: Philip Ng, Cupertino, CA (US)

(73) Assignee: Atmel Corporation, San Jose, CA (US)

(*) Notice: Subject to any disclaimer, the term of this patent is extended or adjusted under 35 U.S.C. 154(b) by 225 days.

(21) Appl. No.: 13/416,994

(22) Filed: Mar. 9, 2012

(65) Prior Publication Data

US 2013/0238963 A1 Sep. 12, 2013

(51) Int. Cl.
*H03M 13/00* (2006.01)
*G06F 11/00* (2006.01)
*H03M 13/09* (2006.01)

(52) U.S. Cl.
CPC ....... *H03M 13/09* (2013.01); *G06F 2211/1057* (2013.01)
USPC .......................................... 714/801; 714/757

(58) Field of Classification Search
CPC ................ G06F 11/1076; G06F 11/10; G06F 2211/1054; G06F 11/14; H03M 13/09; H03M 13/098; H03M 13/03; H04L 1/0063; H04L 1/0061
USPC .................. 714/800, 801, 701, 752, 757, 785
See application file for complete search history.

(56) References Cited

U.S. PATENT DOCUMENTS

| 4,823,347 A * | 4/1989 | Chin et al. ..................... 714/800 |
| 7,805,665 B2 * | 9/2010 | Chou et al. ..................... 714/801 |
| 2012/0213016 A1 * | 8/2012 | Iida ............................... 365/191 |

* cited by examiner

*Primary Examiner* — Christine Tu
(74) *Attorney, Agent, or Firm* — Fish & Richardson, P.C.

(57) ABSTRACT

Systems and techniques for serial data stream operations are described. A described system includes a serial bus communicatively coupled with a memory structure to handle a serial data stream from or to the memory structure; generators configured to generate enablement signals that are associated with different bit-groups of the serial data stream, each of the enablement signals including pulses that are aligned with time-slots that are associated with a respective bit-group; logic elements configured to store internal states and produce output signals that are based on the serial data stream, the enablement signals, and the internal states, and circuitry configured to capture values. Each of the enablement signals enables a respective logic element to selectively change a respective internal state responsive to bit-values of a respective bit-group. Each of the captured values represents an output of a respective logic element that is responsive to all bit-values of a respective bit-group.

20 Claims, 7 Drawing Sheets

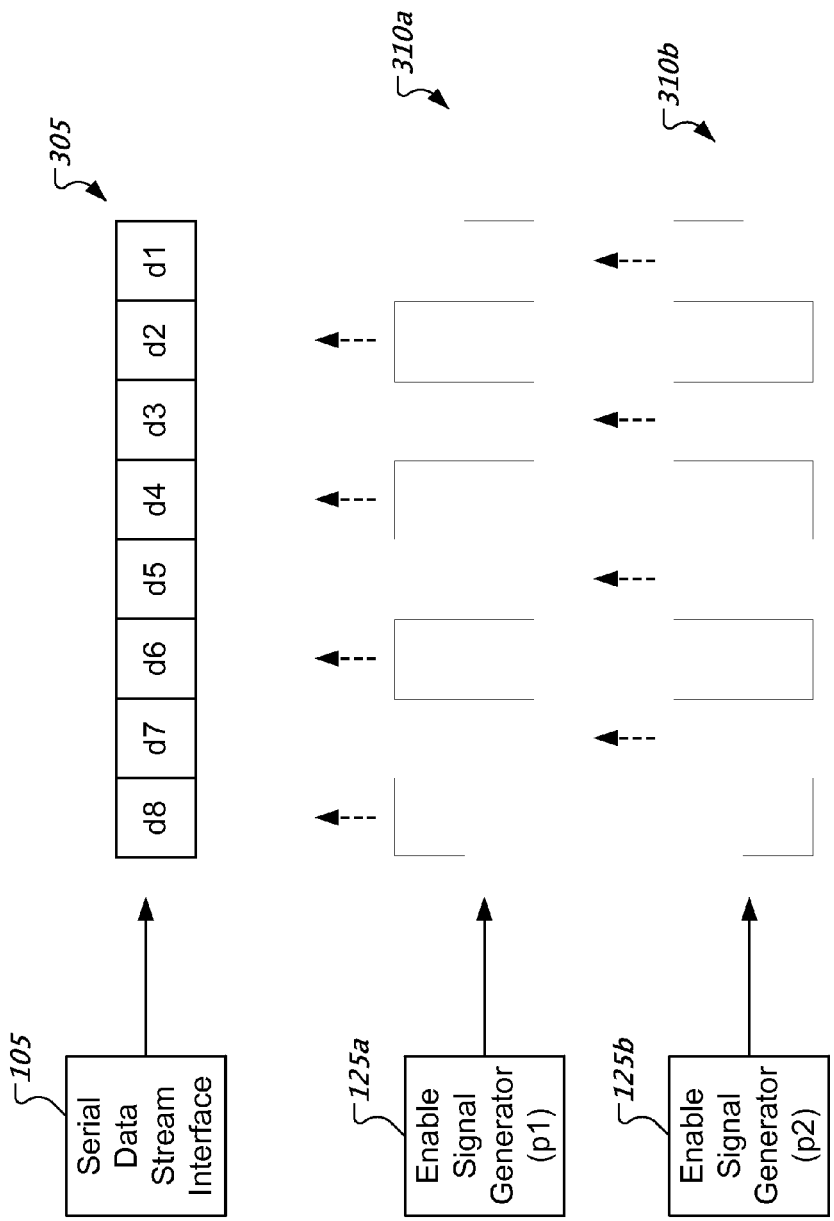

DIGITAL ARCHITECTURES FOR SERIAL DATA STREAM OPERATIONS

TECHNICAL FIELD

This patent document relates generally to digital architectures such as error encoding and decoding architectures for serial data streams.

BACKGROUND

Computer systems use memory structures for storing and retrieving data. Sometimes, stored data becomes corrupted or the act of retrieving the stored data may corrupt the data. Typically, the computer systems employ an error-correcting code (ECC) for the detection and correction of one or more bit-errors. An encoded data element can include a data element and parity bits. For example, a 38-bit encoded data element can include a 32-bit data element (e.g., a 32-bit data element includes 32 data bits) and 6 parity bits. The parity bits can be generated based on an ECC such as a Hamming code and the data element. On retrieval of the encoded data element, checksum bits are generated based on the encoded data element. Using the checksum bits, a bit-error occurring in the data element or in the parity bits can be detected and corrected. Typically, computer systems use trees of XOR logic to compute the parity bits and the checksum bits.

SUMMARY

This document describes, among other things, technologies relating to digital architectures that employ logic such as toggle flip-flop (TFF) logic for performing operations on serial data stream. In one aspect, a described architecture includes a serial bus that provides a serial data stream; a first generator configured to generate a first signal, the first signal including first pulses that are aligned with first time-slots corresponding to a first group of bits of the serial data stream; a second generator configured to generate a second signal, the second signal including second pulses that are aligned respectively with second time-slots corresponding to a second group of bits of the serial data stream; a first flip-flop configured to produce a first output signal based on the serial data stream, the first signal, and a first state, the first pulses enabling the first flip-flop to selectively change the first state responsive to values of the first group of bits; a second flip-flop configured to produce a second output signal based on the serial data stream, the second signal, and a second state, the second pulses enabling the second flip-flop to selectively change the second state responsive to values of the second group of bits; circuitry configured to capture a first value from the first output signal based on an end of the first group of bits; and circuitry configured to capture a second value from the second output signal based on an end of the second group of bits.

This and other implementations can include one or more of the following features. The first value can represent a first parity bit that is based on the first group of bits. The second value can represent a second parity bit that is based on the second group of bits. Implementations can include circuitry to output an encoded data stream that includes the serial data stream and parity bits. The parity bits can include a first parity bit that is based on the first value, and a second parity bit that is based on the second value. The serial data stream can include parity bits, where the first group of bits can include at least one of the parity bits. Implementations can include circuitry to detect a bit error associated with the serial data stream based on checksum values including the first value and the second value. In some implementations, the first group of bits partially overlap with the second group of bits. In some implementations, the first group of bits do not overlap with the second group of bits.

In another aspect, a system for data stream operations can include a memory structure, a serial bus communicatively coupled with the memory structure to handle a serial data stream from or to the memory structure; generators configured to generate enablement signals that are associated with different bit-groups of the serial data stream, each of the enablement signals including pulses that are aligned with time-slots that are associated with a respective bit-group; logic elements configured to store internal states and produce output signals that are based on the serial data stream, the enablement signals, and the internal states, and circuitry configured to capture values indicated by the output signals. Each of the enablement signals can enable a respective logic element to selectively change a respective internal state responsive to bit-values of a respective bit-group. Each of the values can represent an output of a respective logic element that is responsive to all bit-values of a respective bit-group.

The serial data stream, in some implementations, includes parity bits, where at least a portion of the output signals are responsive to the parity bits. Implementations can include circuitry to detect a bit error associated with the serial data stream based on checksum values including the values indicated by the output signals. In some implementations, the values represent parity bits for the bit-groups, respectively, where the memory structure stores an encoded data stream that includes the serial data stream and the parity bits. In some implementations, two or more of the bit-groups partially overlap. In some implementations, at least two of the bit-groups do not overlap.

In yet another aspect, a technique for data stream operations can include obtaining a serial data stream via a serial bus; generating enablement signals that are associated with different bit-groups of the serial data stream, each of the enablement signals including pulses that are aligned with time-slots that are associated with a respective bit-group; producing, via toggle flip-flops, output signals that are based on the serial data stream, the enablement signals, and the internal states, each of the enablement signals enabling a respective toggle flip-flop to selectively change a respective internal state responsive to bit-values of a respective bit-group; and capturing values based on the output signals, each of the values representing an output of a respective toggle flip-flop that is responsive to all bit-values of a respective bit-group.

The values, in some implementations, can represent parity bits for the bit-groups, respectively. Implementations can include providing an encoded data stream that includes the serial data stream and the parity bits. The serial data stream can include parity bits, where at least a portion of the output signals are responsive to the parity bits. Obtaining the serial data stream can include accessing a memory structure to retrieve an encoded data stream that includes the serial data stream and the parity bits. The serial data stream can include parity bits, and the first group of bits can include at least one of the parity bits. Implementations can include detecting a bit error associated with the serial data stream based on checksum values including the values indicated by the output signals. In some implementations, two or more of the bit-groups partially overlap. In some implementations, at least two of the bit-groups do not overlap.

Particular embodiments of the technology described in this document can be implemented so as to realize one or more of the following advantages. One or more of the described technologies are suitable for pin-constrained environments where integrated circuit manufactures desire to minimize the number of external pins for transferring data. One or more of the described technologies can replace a complex XOR logic tree with a single toggle flip-flop. Such replacement can reduce the chip area dedicated to generating error detection codes and the chip area dedicated to detecting bit-errors.

The details of one or more embodiments of the subject matter described in this document are set forth in the accompanying drawings and the description below. Other features, aspects, and advantages of the subject matter will become apparent from the description, the drawings, and the claims.

BRIEF DESCRIPTION OF THE DRAWINGS

FIG. 3 shows different enablement signal waveforms that are associated with different parity bits.

Like reference numbers and designations in the various drawings indicate like elements.

DETAILED DESCRIPTION

Figure 1:
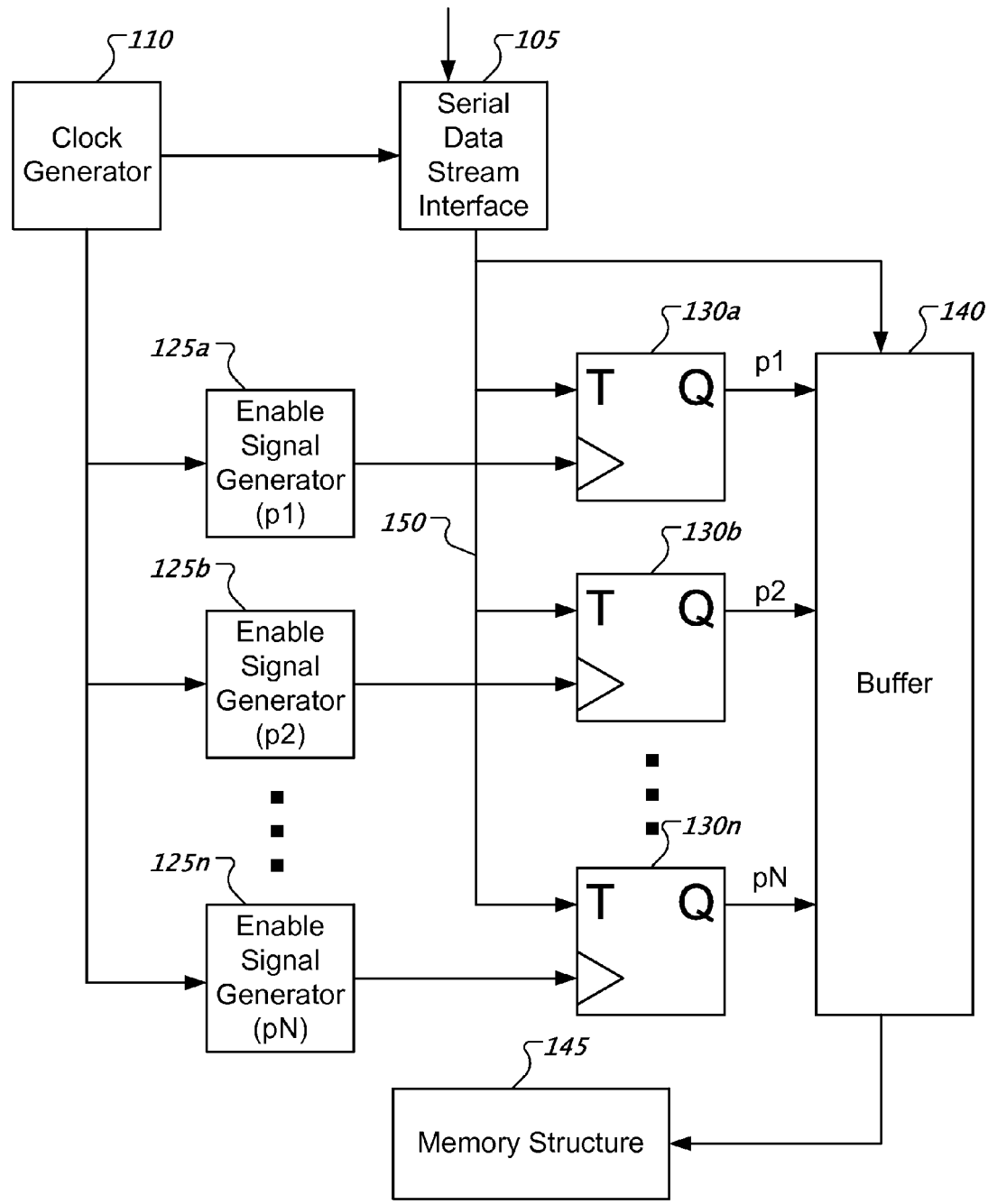
FIG. 1 shows a simplified schematic diagram of an example encoding circuitry architecture that uses TFFs to generate parity bits.

FIG. 1 shows a simplified schematic diagram of an example encoding circuitry architecture that uses TFFs 130*a-n* to generate parity bits. A data processing apparatus can include encoding circuitry to generate parity bits (p1, p2, . . . , pN) for a serial data stream. The data processing apparatus can cause an encoded serial data stream to be stored in a memory structure 145 such as flash memory, hard disk drive, or dynamic random-access memory (DRAM). The encoded serial data stream includes the serial data stream and the parity bits. The parity bits can be generated using an error correction code such that a single bit-error can be detected and corrected when reading the encoded serial data stream from the memory structure 145. Some error correction codes can permit multiple bit-errors to be detected and corrected. The encoding circuitry includes a serial data stream interface 105 that receives a serial data stream from a source such as a processor or peripheral device. The interface 105 uses a clock signal from a clock generator 110 to receive the serial data stream. The interface 105 distributes the serial data stream via a serial bus 150 to multiple TFFs 130*a-n*. The serial bus 150 can be configured to transfer one bit per clock pulse.

The TFFs 130*a-n* are assigned to determine parity bits, respectively. Each TFF 130*a-n* produces an output Q based on an internal state. In some implementations, each TFF 130*a-n* produces an auxiliary output $\overline{Q}$ which is the opposite of Q. The next value of the internal state is based on an input T, clock input, and a current value of the internal state. When a clock input is strobed (e.g., receives a clock signal pulse such as a transition from high to low or low to high), a TFF 130*a-n* is enabled to selectively change its internal state (e.g., $Q_{i+1}$=T$\overline{Q_i}$+T$\overline{Q_i}$). If the clock input is not strobed, the TFF 130*a-n* retains its internal state regardless of the input T.

The enable signal generators 125*a-n* generate enablement signals that are provided to respective TFFs 130*a-n* as clock signals. An enablement signal includes pulses that are aligned respectively with time-slots corresponding to a group of bits of the serial data stream. Each enablement signal corresponds to a different group of bits, albeit some groups can partially overlap. The enable signal generators 125*a-n* use a clock signal from the clock generator 110 to generate the respective enablement signals. In some implementations, an enable signal generator 125*a* is configured to generate a pulse based on every other pulse of the clock signal. In some implementations, an enable signal generator 125*b* is configured to generate pulses within one or more predetermined windows that corresponds to one or more predetermined ranges of bits within the serial data stream (e.g., bits 1-16, bits 16-32, or bits 8-16 and 24-32).

The buffer 140 can be configured to capture parity bits based on outputs from the TFFs 130*a-n*, respectively. For example, the serial data stream can transfer 32-bit data elements. After the 32nd time-slot, which includes the 32nd data bit, the buffer 140 accesses the outputs from the TFFs 130*a-n*. Note that some parity bits can be determined prior to the 32nd bit, and thus, can be captured sooner. In some implementations, the buffer 140 includes one or more registers to store the parity bits and the incoming data bits. In some implementations, the buffer 140 interleaves the parity bits with the data bits to generate an encoded data stream. The data processing apparatus can store the encoded data stream within the memory structure 145. In some implementations, the parity bits are stored as a contiguous sequence of bits. In some implementations, the data bits are stored in a first area of the memory structure 145 and the parity bits are stored in a second non-adjacent area of the memory structure 145. Based on capturing the parity bits, the buffer 140 can reset the TFFs 130*a-n* to an initial state.

Figures 2A, 2B:
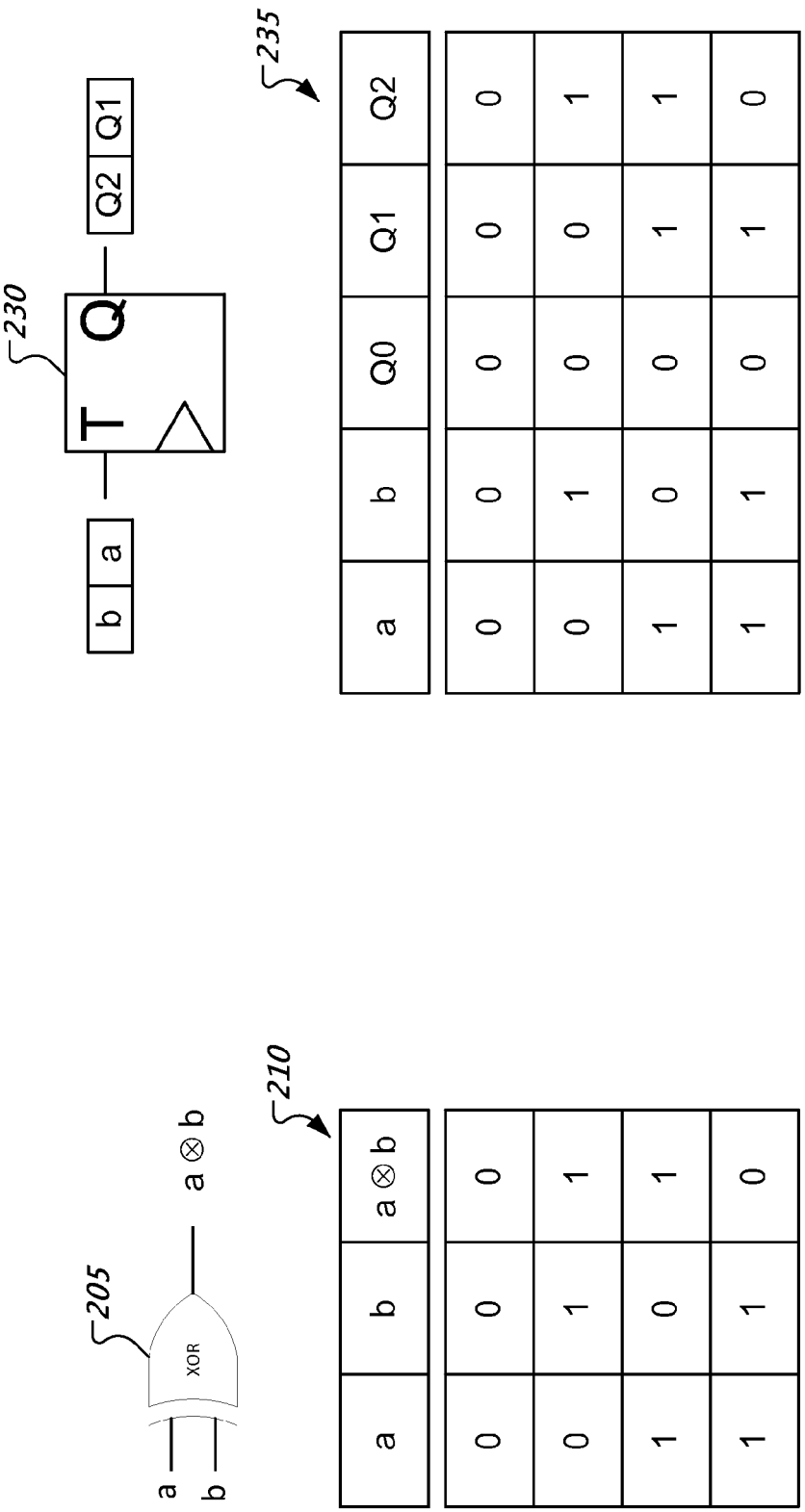
FIG. 2A shows a logic table that depicts output values for a XOR gate.
FIG. 2B shows a logic table that depicts output values for a TFF for two successive iterations.

FIG. 2A shows a logic table 210 that depicts output values for a XOR gate 205. The XOR gate 205 takes two inputs (a, b) and produces an output according to the logic table 210. In mathematical terms, the output of the XOR gate 205 is equal to (a+b) % 2.

FIG. 2B shows a logic table 235 that depicts output values for a TFF 230 for two successive iterations. In contrast to the XOR gate 205, input to the TFF 230 is serial. Note that an initial state (Q0) of the TFF 230 is zero. After providing the first input (a) to the TFF 230, the state of the TFF 230 transitions to Q1. After providing the second input (b) to the TFF 230, the state of the TFF 230 transitions to Q2. As depicted by respective logic tables 210 and 235, the output of the XOR gate 205 is equivalent to the output of the TFF 230 at Q2.

Figure 2C:
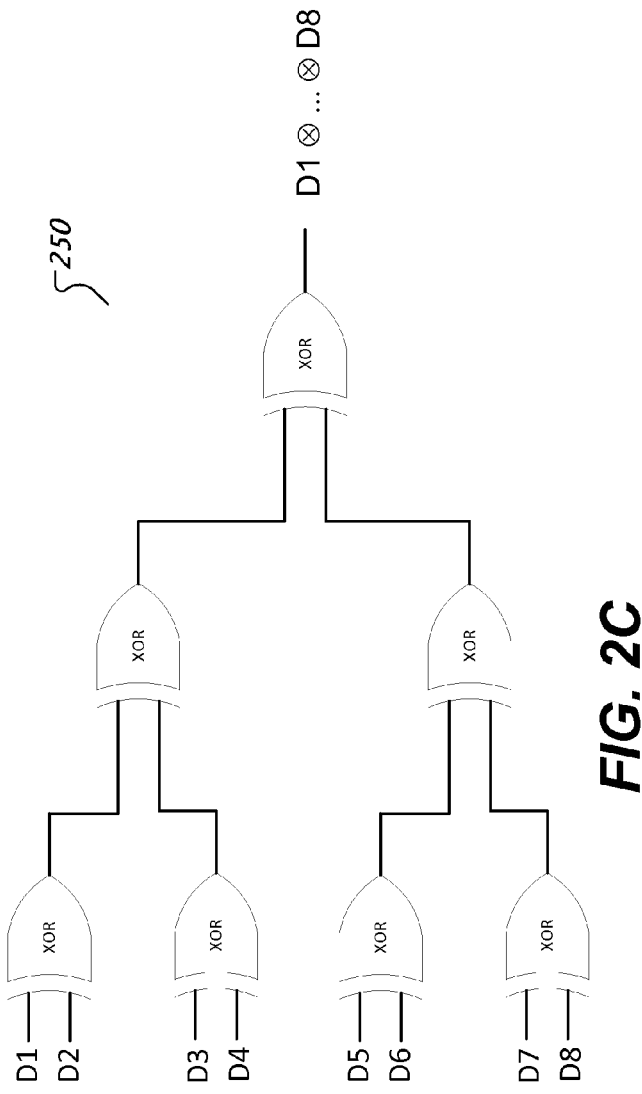
FIG. 2C shows a network of XOR gates.

FIG. 2C shows a network 250 of XOR gates. A group of data bits (D1 to D8) is input to a network 250 of XOR gates that is configured to compute and output the XOR among all of the bits in the group (e.g., output=D1 $\otimes$ . . . $\otimes$ D8).

Figure 2D:
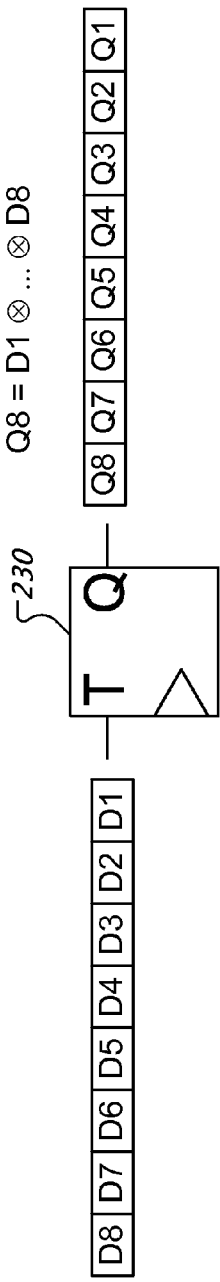
FIG. 2D shows TFF based computations that are equivalent to an output of the network of XOR gates of FIG. 2C.

FIG. 2D shows TFF based computations that are equivalent to an output of the network 250 of XOR gates of FIG. 2C. The same group of data bits (D1 to D8) that is used in FIG. 2C can be provided serially into a TFF 230 to produce outputs Q1 to Q8. Based on providing all of the data bits (D1 to D8) to the TFF 230, the last output (Q8) is equivalent to the XOR among all of the bits in the group (e.g., Q8=D1 $\otimes$ . . . $\otimes$ D8). Replacing a network of XOR gates with a TFF can reduce the number of transistors required to perform operations such as error encoding, error detecting, cryptographic operations, or video encoding or decoding operations.

FIG. 3 shows different enablement signal waveforms 310a-b that are associated with different parity bits. A first enable signal generator 125a generates a first enablement signal. A second enable signal generator 125b generates a second enablement signal. Waveforms 310a-b of the first and second enablement signals are depicted by FIG. 3. The waveforms 310a-b are coordinated to the bits of a serial data stream 305, which is provided by a serial data stream interface 105. In this example, pulses of the first enablement signal from the first generator 125a correspond to time-slots for a first group of data bits (e.g., a first bit-group that includes d2, d4, d6, and d8) of a serial data stream 305, whereas pulses of the second enablement signal from the second generator 125b correspond to time-slots for a second group of data bits (e.g., a second bit-group that includes d1, d3, d5, and d7) of the serial data stream 305. The pulses of the waveforms 310a-b are examples for illustration purposes. Other arrangements of pulses are possible.

Figure 4:
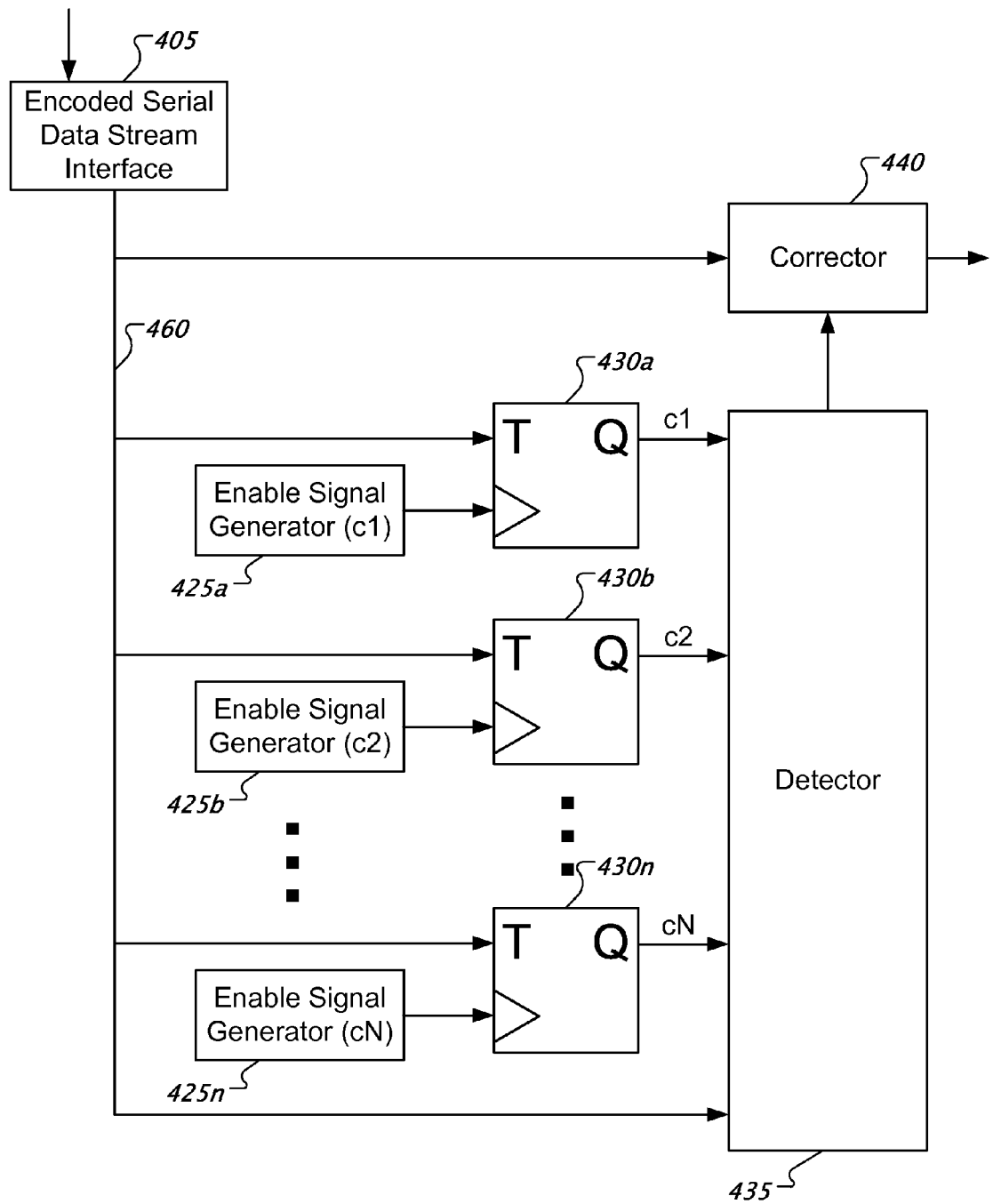
FIG. 4 shows a simplified schematic diagram of an example decoding circuitry architecture that uses TFFs to generate checksum bits.

FIG. 4 shows a simplified schematic diagram of an example decoding circuitry architecture that uses toggle flip-flops 430a-n to generate checksum bits. A data processing apparatus can include decoding circuitry to generate checksum bits (c1, c2, ... cN) based on an encoded serial data stream. In some implementations, an encoded serial data stream includes data bits interleaved with parity bits. The decoding circuitry includes a serial data stream interface 405 that receives a serial data stream, such as an encoded serial data stream, from a source such as a memory structure or a peripheral device. The interface 405 can use a clock signal from a clock generator to receive the serial data stream. The interface 405 distributes the serial data stream via a serial bus 460 to multiple TFFs 430a-n that are assigned to determine the checksum bits, respectively. Each of the TFFs 430a-n produces an output responsive to an input T, clock input, and a current value of its internal state.

The enable signal generators 425a-n generate enablement signals that are provided to respective TFFs 430a-n as clock signals. An enablement signal includes pulses that are aligned respectively with time-slots corresponding to a group of bits of the serial data stream. Each enablement signal corresponds to a different group of bits, albeit some groups can partially overlap. In this example, a group of bit can include one or more data bits, one or more parity bits, or a combination thereof. The enable signal generators 425a-n can use a clock signal from a clock generator to generate the respective enablement signals. In some implementations, an enable signal generator 425a-n can be configured to generate pulses based on pulses of a clock signal. In some implementations, an enable signal generator 425a-n can be configured to generate pulses within one or more predetermined windows that corresponds to one or more predetermined ranges of bits within the serial data stream (e.g., bits 1-16, bits 16-32, or bits 8-16 and 24-32).

A detector 435 is configured to capture checksum bits based on outputs from the TFFs 430a-n, respectively. For example, the serial data stream can transfer a 38-bit encoded data element that includes a 32-bit data element and 6 parity bits. After the 38th time-slot, which includes the 38th bit, the detector 435 accesses the outputs from the TFFs 430a-n. Note that some checksum bits can be determined prior to the 38nd bit, and thus, can be captured sooner. The checksum bits can be used to detect a bit-error within the encoded data element and, if one exists, determine the bit-position of the bit-error. The corrector 440 can use the bit-position that is determined by the detector 435 to flip a corresponding value of the serial data stream (e.g., 0 to 1, or 1 to 0). This bit-position may be a data bit or a parity bit. In some implementations, the corrector 440 strips out the parity bits from the data stream, and if the bit-position is a parity bit then the corrector 440 may ignore the bit-position.

Figure 5:
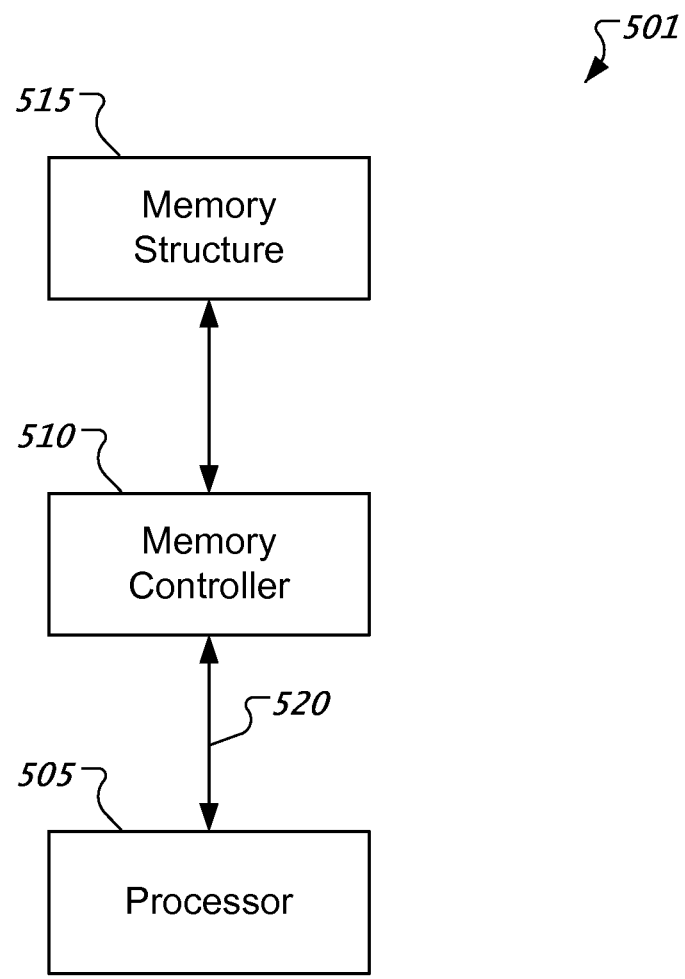
FIG. 5 shows a simplified schematic diagram of an example architecture of a data processing apparatus.

FIG. 5 shows a simplified schematic diagram of an example architecture of a data processing apparatus 501. The data processing apparatus 501 includes a processor 505, memory controller 510, and a memory structure 515. In some implementations, the processor resides on a first integrated circuit and the memory controller 510 resides on a second integrated circuit. To reduce the number of external pins, the data processing apparatus 501 uses a serial bus 510 between the processor 505 and the memory controller 510. The memory controller 510 can include encoding circuitry that uses logic elements to compute parity bits for data that will be stored on the memory structure 515. The memory controller 510 can include decoding circuitry that uses logic elements to compute checksum bits for data that are retrieved from the memory structure 515. Based on a bit-error indicated by the read data, the memory controller 510 can correct the bit-error. In some implementations, a logic element includes a TFF. In some implementations, another type of flip-flop can be converted into a TFF. For example, a D flip-flop (DFF) can be converted into a TFF, where an input to the DFF is based on an input signal and an output of the DFF.

Figure 6:
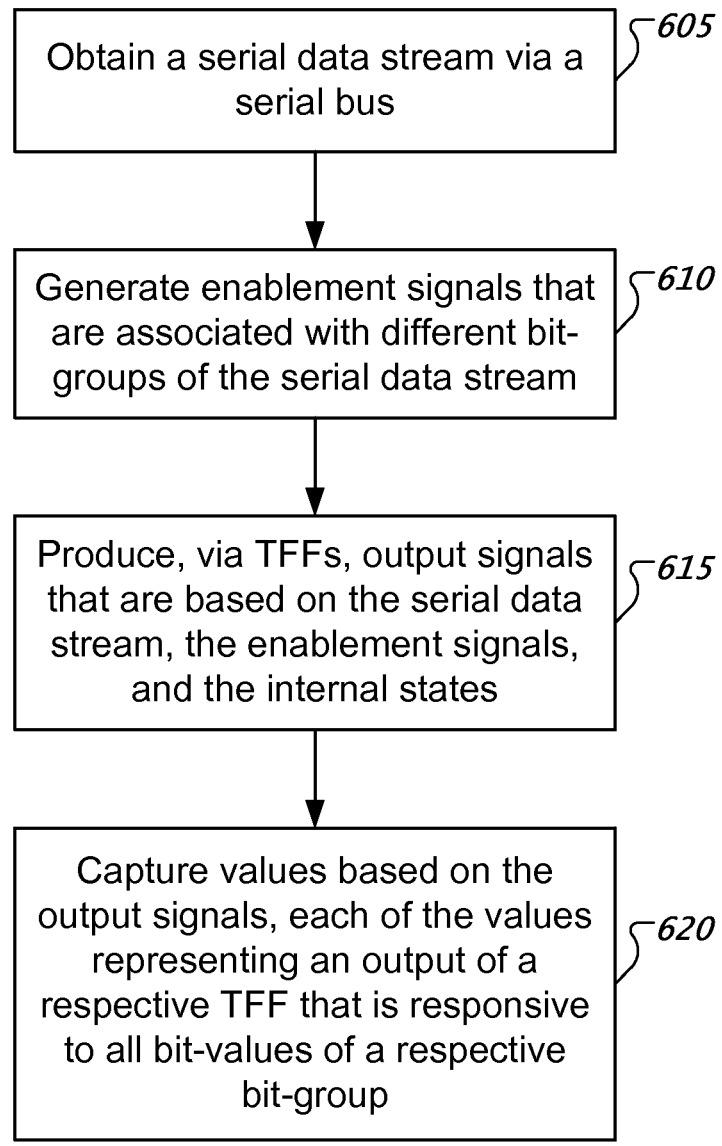
FIG. 6 shows a flowchart of an example process for using TFFs to compute values such as parity bit values or checksum bit values.

FIG. 6 shows a flowchart of an example process for using TFFs to compute values such as parity bit values or checksum bit values. At 605, the process obtains a serial data stream via a serial bus. Obtaining a serial data stream can include receiving a serial data stream from a source such as a processor, peripheral device, or a memory structure. In some implementations, the serial data stream represents an encoded data stream that includes data bits and parity bits, and the process is configured to perform bit-error detection and correction. In some implementations, the serial data stream represents an un-encoded data stream that includes data bits, and the process is configured to error correction encoding.

At 610, the process generates enablement signals that are associated with different bit-groups of the serial data stream. Each of the enablement signals can include pulses that are aligned with time-slots that are associated with a respective bit-group. For example, a first signal can be aligned with time-slots corresponding to bits of a first bit-group, whereas a second signal can be aligned with time-slots corresponding to bits of a second bit-group. In some implementations, the first bit-group either partially overlaps or does not overlap with the second bit-group, which is determined by an error encoding technique. Generating an enablement signal can include driving logic circuitry via a clock signal. The logic circuitry can be configured to output pulses based on a predetermined number of pulses of the clock signal (e.g., every pulse, every second pulse, every four pulse, etc.).

At 615, the process produces, via TFFs, output signals that are based on the serial data stream, the enablement signals, and the internal states. In some implementations, the TFFs receive their respective enablement signals via a TFF clock input port. Each of the enablement signals can enable a respective TFF to selectively change a respective internal state responsive to bit-values of a respective bit-group. For example, when enabled, the next value of the internal state is based on the current value of the internal state and an input value (e.g., see FIG. 2B).

At 620, the process captures values based on the output signals, each of the values representing an output of a respective TFF that is responsive to all bit-values of a respective bit-group. While the serial data stream is provided to a TFF, the output of the TFF may oscillate between high and low values. For determining a parity bit for a bit-group, a TFF is required to process all of the bit-values that constitute the parity bit. Thus, the TFF outputs the parity bit only after the TFF has acted on all of the bit-values of the bit-group. Capturing a value based on an output signal can include accessing the output signal at a predetermined time. The predetermined time can correspond to an end of the last bit-value of the bit-group. In some implementations, the process captures the values based on an ending of a data element within the serial data stream. For the next data element within the serial data stream, the process can reset the TFFs to an initial state.

An encoding process can compute parity bits P1, P2, P4, P8, P16, and P32 for a 32-bit value having data bits D1 through D32. In some implementations, P1 is computed based on an XOR of the values for the following group (G1) of data bits: 1, 2, 4, 5, 7, 9, 11, 12, 14, 16, 18, 20, 22, 24, 26, 27, 29, and 31. P2 is computed based on an XOR of the values for the following group (G2) of data bits: 1, 3, 4, 6, 7, 10, 11, 13, 14, 17, 18, 21, 22, 25, 26, 28, 29, and 32. P4 is computed based on an XOR of the values for the following group (G4) of data bits: 2-4, 8-11, 15-18, 23-26, and 30-32. P8 is computed based on an XOR of the values for the following group (G8) of data bits: 5-11 and 19-26. P16 is computed based on an XOR of the values for the following group (G16) of data bits: 12-26. P32 is computed based on an XOR of the values for the following group (G32) of data bits: 27-32. In some implementations, a 38-bit encoded group of bits is arranged as follows: P1, P2, D1, P4, D2-D4, P8, D5-D11, P16, D12-D26, P32, and D27-D32 (this arrangement represents positions 1 to 38, respectively).

Based on the encoding process, a decoding process can compute checksum bits C1, C2, C4, C8, C16, and C32 based on an obtained version of the encoded group of bits. In some implementations, C1 is computed based on an XOR of the values for P1 and the G1 group of data bits. C2 is computed based on an XOR of the values for P2 and the G2 group of data bits. C4 is computed based on an XOR of the values for P4 and the G4 group of data bits. C8 is computed based on an XOR of the values for P8 and the G8 group of data bits. C16 is computed based on an XOR of the values for P16 and the G16 group of data bits. C32 is computed based on an XOR of the values for P32 and the G32 group of data bits. The decoding process can use the checksum bits to compute a position of a single bit error. In some implementations, EP=C1*1+C2*2+C4*4+C8*8+C16*16+C32*32, where EP represents the error position and the EP can be a value between 1 and 38. Based on the above given arrangement for a 38-bit encoded bit string, an EP of 1, for example indicates an error in the P1 bit, whereas an EP of 38 indicates an error in the D32 bit.

While this document contains many specific implementation details, these should not be construed as limitations on the scope of any inventions or of what may be claimed, but rather as descriptions of features specific to particular embodiments of particular inventions. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. An apparatus comprising:
   a serial bus that provides a serial data stream;
   a first generator configured to generate a first signal, the first signal comprising first pulses that are aligned with first time-slots corresponding to a first group of bits of the serial data stream;
   a second generator configured to generate a second signal, the second signal comprising second pulses that are aligned respectively with second time-slots corresponding to a second group of bits of the serial data stream;
   a first flip-flop configured to produce a first output signal based on the serial data stream, the first signal and a first internal state of the first flip-flop;
   a second flip-flop configured to produce a second output signal based on the serial data stream, the second signal and a second internal state of the second flip-flop;
   first circuitry configured to capture a first value from the first output signal based on an end of the first group of bits of the serial data stream; and
   second circuitry configured to capture a second value from the second output signal based on an end of the second group of bits of the serial data stream.

2. The apparatus of claim 1, wherein the first value represents a first parity bit that is based on the first group of bits, and wherein the second value represents a second parity bit that is based on the second group of bits.

3. The apparatus of claim 1, further comprising:
   third circuitry to output a data stream that comprises the serial data stream and parity bits, wherein the parity bits comprise a first parity bit that is based on the first value, and a second parity bit that is based on the second value.

4. The apparatus of claim 1, wherein the serial data stream comprises parity bits, wherein the first group of bits includes at least one of the parity bits.

5. The apparatus of claim 4, further comprising:
   third circuitry to detect a bit error associated with the serial data stream based on the first value and the second value.

6. The apparatus of claim 1, wherein the first group of bits partially overlap with the second group of bits.

7. The apparatus of claim 1, wherein the first group of bits do not overlap with the second group of bits.

8. A system comprising:
   a memory structure configured to store data;
   a serial bus communicatively coupled with the memory structure to handle a serial data stream from or to the memory structure;
   first and second generators configured to generate first and second enablement signals that are associated with first and second bit-groups of the serial data stream, the first and second enablement signals comprising pulses that are aligned with time-slots that are associated with the first and second bit-groups;
   first and second logic elements configured to store first and second internal states of the first and second logic elements and produce first and second output signals that are based on the serial data stream, the first and second enablement signals and the first and second internal states; and
   first and second circuitry configured to capture first and second values from the first and second output signals based on an end of the first and second bit-groups of the serial data stream.

9. The system of claim 8, wherein the first and second values represent parity bits for the first and second bit-groups, respectively, wherein the memory structure stores an encoded data stream that includes the serial data stream and the parity bits.

10. The system of claim 8, wherein the serial data stream comprises parity bits, wherein at least a portion of the first and second output signals are responsive to the parity bits.

11. The system of claim 10, further comprising:
third circuitry to detect a bit error associated with the serial data stream based on the first and second values indicated by the first and second output signals.

12. The system of claim 8, wherein the first and second bit-groups partially overlap.

13. The system of claim 8, wherein the first and second bit-groups do not overlap.

14. A method comprising:
obtaining a serial data stream via a serial bus;
generating first and second enablement signals that are associated with first and second bit-groups of the serial data stream, the first and second enablement signals comprising pulses that are aligned with time-slots that are associated with the first and second bit-groups;
producing, via toggle flip-flops, first and second output signals that are based on the serial data stream, the first and second enablement signalsand first and second internal states of the toggle flip-flops; and first and second circuitry configured to capture first and second values from the first and second output signals based on an end of the first and second bit-groups of the serial data stream.

15. The method of claim 14, wherein the first and second values represent parity bits for the first and second bit-groups, respectively, wherein the method further comprises providing an encoded data stream that comprises the serial data stream and the parity bits.

16. The method of claim 14, wherein the serial data stream comprises parity bits, wherein at least a portion of the first and second output signals are responsive to the parity bits, and wherein obtaining the serial data stream comprises accessing a memory structure to retrieve an encoded data stream that includes the serial data stream and the parity bits.

17. The method of claim 14, wherein the serial data stream comprises parity bits, wherein the first bit-group includes at least one of the parity bits.

18. The method of claim 17, further comprising:
detecting a bit error associated with the serial data stream based on the first and second values indicated by the first and second output signals.

19. The method of claim 14, wherein the first and second bit-groups partially overlap.

20. The method of claim 14, wherein the first and second bit-groups do not overlap.

* * * * *

UNITED STATES PATENT AND TRADEMARK OFFICE
CERTIFICATE OF CORRECTION

Page 1 of 1

PATENT NO. : 8,839,084 B2
APPLICATION NO. : 13/416994
DATED : September 16, 2014
INVENTOR(S) : Philip S. Ng It is certified that error appears in the above-identified patent and that said Letters Patent is hereby corrected as shown below:

In the Claims

Col. 9, line 25, Claim 14, delete "signalsand" and insert -- signals and --, therefor.

Signed and Sealed this
Nineteenth Day of May, 2015

Michelle K. Lee
*Director of the United States Patent and Trademark Office*